(12) United States Patent
Redaelli

(10) Patent No.: US 10,825,863 B2
(45) Date of Patent: Nov. 3, 2020

(54) DECK-TO-DECK RESET CURRENT OFFSET SUPPRESSION FOR THREE-DIMENSIONAL (3D) MEMORY

(71) Applicant: Intel Corporation, Santa Clara, CA (US)

(72) Inventor: Andrea Redaelli, Casatenovo (IT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/361,030

(22) Filed: Mar. 21, 2019

(65) Prior Publication Data

US 2020/0303463 A1    Sep. 24, 2020

(51) Int. Cl.
*H01L 27/24* (2006.01)
*H01L 45/00* (2006.01)
*G11C 13/00* (2006.01)

(52) U.S. Cl.
CPC ........ *H01L 27/2481* (2013.01); *G11C 13/003* (2013.01); *G11C 13/004* (2013.01); *G11C 13/0004* (2013.01); *G11C 13/0069* (2013.01); *H01L 45/06* (2013.01); *H01L 45/1233* (2013.01); *H01L 45/141* (2013.01); *G11C 2213/71* (2013.01); *H01L 45/1253* (2013.01)

(58) Field of Classification Search
CPC . H01L 27/2481; H01L 45/06; H01L 45/1233; H01L 45/1253
See application file for complete search history.

(56) References Cited

U.S. PATENT DOCUMENTS

| 9,716,129 B1 * | 7/2017 | Sim ..................... H01L 27/2481 |
| 9,741,764 B1 * | 8/2017 | Terai ................... H01L 27/2427 |
| 2017/0271592 A1 * | 9/2017 | Lee ..................... H01L 27/2427 |
| 2019/0043807 A1 | 2/2019 | Redaelli et al. |

\* cited by examiner

*Primary Examiner* — Allison Bernstein
(74) *Attorney, Agent, or Firm* — Compass IP Law, PC

(57) ABSTRACT

A three-dimensional (3D) memory device includes multiple decks of memory cells. Each deck includes layers of material, including a layer of storage material (e.g., a phase change material). Each deck also includes an interlayer between the phase change material and conductive access lines. The interlayer can include, for example, one or more of tungsten, carbon, silicon, silicon oxide, silicon nitride, aluminum oxide, hafnium oxide, and titanium silicon nitride. In one such example, the interlayer includes tungsten silicon nitride (WSiN). The interlayers of different decks have different properties, such as different thicknesses or resistivities, to reduce or eliminate the deck-to-deck reset current offset.

20 Claims, 6 Drawing Sheets

|  | D0 thickness [A] | D0 resistivity [mOhm cm] | D0 IRST [uA] | D1 thickness [A] | D1 resistivity [mOhm cm] | D1 IRST [uA] |
|---|---|---|---|---|---|---|
| Example 0 | 50 | 190 | 122 | 50 | 190 | 115 |
| Example 1 | 90 | 90 | 119 | 30 | 90 | 119 |
| Example 2 | 50 | 500 | 118 | 50 | 10 | 118 |
| Example 3 | 70 | 220 | 119 | 30 | 90 | 119 |

FIG. 4

DECK-TO-DECK RESET CURRENT OFFSET SUPPRESSION FOR THREE-DIMENSIONAL (3D) MEMORY

FIELD

The descriptions are generally related to memory, and more particularly, to techniques to suppress reset current offset between decks in a three-dimensional memory device.

BACKGROUND

Memory resources have innumerable applications in electronic devices and other computing environments. There is demand for memory technologies that can scale smaller than traditional memory devices. However, continued drive to smaller and more energy efficient devices has resulted in scaling issues with traditional memory devices. Three-dimensional memory devices emerged as a solution to the scaling limitations of traditional memory devices.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing at least one implementation of the invention that includes one or more particular features, structures, or characteristics. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is a table illustrating examples of the thickness and resistivity of metal silicon nitride layers in two decks and the resulting impact on reset current in those decks.

Descriptions of certain details and implementations follow, including a description of the figures, which may depict some or all of the embodiments described below, as well as discussing other potential embodiments or implementations of the inventive concepts presented herein.

DETAILED DESCRIPTION

Techniques for addressing reset current offset amongst decks for three-dimensional (3D) memory devices are described herein.

3D memory technologies typically include multiple levels or decks of memory cells. A deck includes layers of patterned material that form the elements of the memory array, including a layer of storage material, conductive electrodes, and conductive access lines. Some 3D memory technologies exhibit electrical differences amongst the decks due to a variety of reasons, including the polarity at which the decks are operated. For example, a memory device that operates the decks at different polarities may experience a high reset current offset amongst decks. In one example, there are some decks that are programmed in positive polarity and some decks that are programmed in reverse polarity, and the difference in programming polarity creates some offset in the reset current. The reset current (IRST or (reset) is the current for resetting a memory cell. In one example, resetting the memory cell is defined as programming the memory cell to a high resistance state. In one example, resetting the memory cell is defined as programming the memory cell to a logic 0. The reset current can be affected by a number of factors. One factor that can impact the reset current is a metal silicon nitride layer between the conductive access lines and the memory element.

In one example, the reset current offset is reduced or eliminated by including tungsten silicon nitride layers with different properties deck-to-deck. In one example, the tungsten silicon nitride layers of different decks have different thicknesses and/or resistivities.

Figure 1:
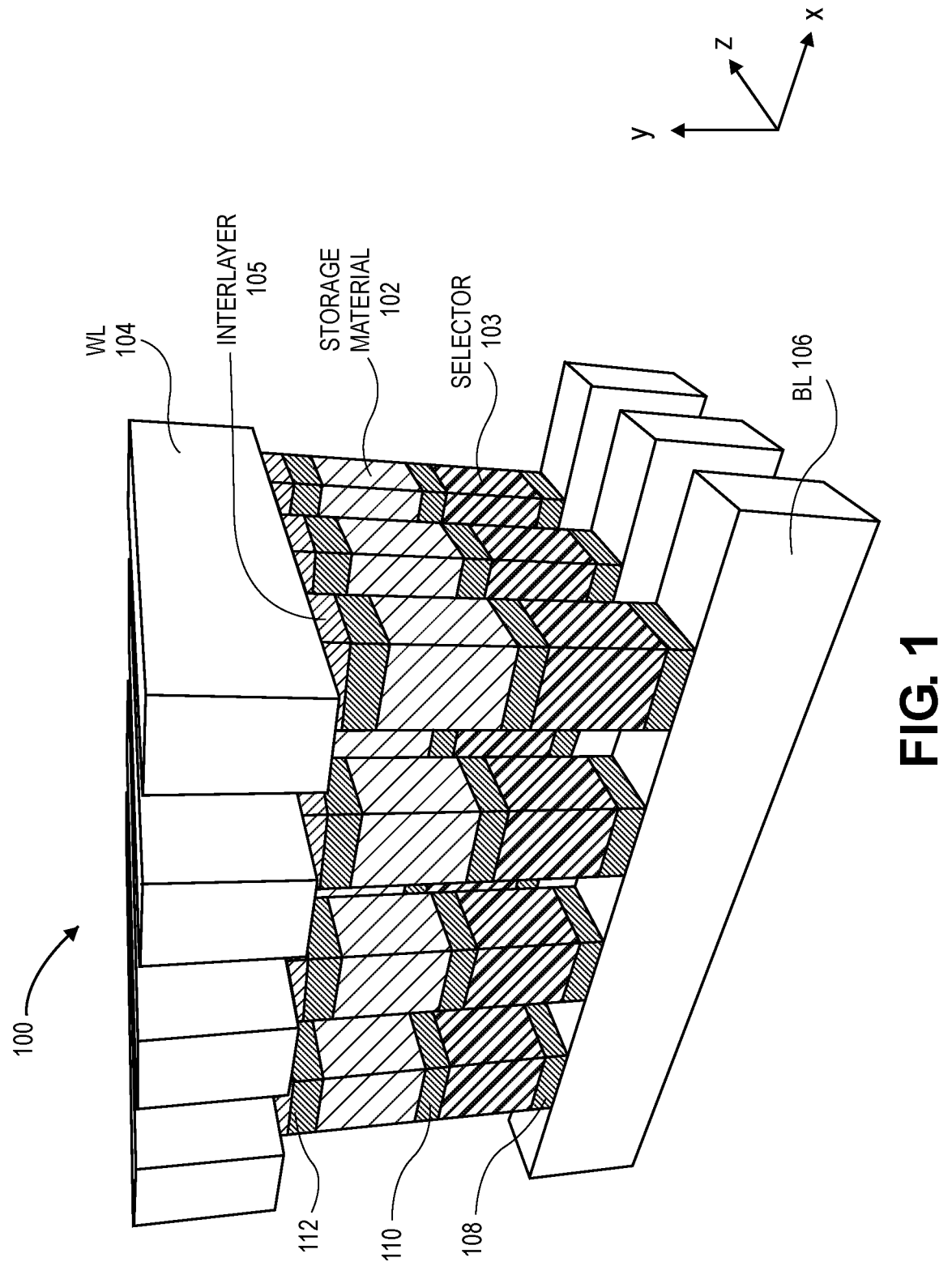
FIG. 1 illustrates an example of a portion of a memory cell array with an interlayer between the storage element and the conductive access lines.

FIG. 1 illustrates an example of a portion of a memory cell array 100 with an interlayer between the memory elements and the conductive access lines. The memory cell array 100 is an example of a three dimensional (3D) cross-point memory structure. The memory cell array 100 includes a plurality of access lines 104, 106 to couple the memory cells with access circuitry. Access lines 104, 106 can be referred to as bitlines and wordlines. In the example illustrated in FIG. 1, the bitlines (e.g., access lines 104) are orthogonal to the wordlines (e.g., access lines 106). In the example illustrated in FIG. 1, a storage material 102 and selector material 103 are disposed between the access lines 104, 106. In this example, a "cross-point" is formed at an intersection between a bitline and a wordline. A memory element is created from the storage material 102 between the bitline and wordline where the bitline and wordline intersect.

The storage material 102 can be a phase change material. A memory using a phase change material for the storage element can be referred to as a phase change memory (PCM). The phase change material can be electrically switched between two or more states, such as a generally amorphous and a generally crystalline state across the entire spectrum between completely amorphous and completely crystalline states. In one embodiment, the storage material includes a chalcogenide material, such as Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, or other chalcogenide materials capable of being programmed to one of multiple states. The hyphenated chemical composition notation indicates the elements included in a particular mixture or compound, e.g., chalcogenide alloy, and is intended to represent all stoichiometries involving the indicated elements, e.g., GeXSbYTeZ having variations in stoichiometries, such as Ge2Sb2Te5, Ge2Sb2Te7, Ge1Sb2Te4, Ge1Sb4Te7, etc. In some examples, the chalcogenide alloy can be doped, such as with indium, yttrium, scandium, boron, nitrogen, oxygen, the like, or a combination thereof. The storage elements can be programmed by application of a voltage, current, heat, or other physical or electrical stimuli to cause a change in state. A non-change material may also be used in which the storage material is capable of switching between two or more stable states without changing phase.

In one example, the selector material 103 includes a chalcogenide glass. Although a separate storage and selector element are illustrated in FIG. 1, other example can include a single self-selecting storage material. A self-selecting storage material is a material that acts as both a selector and a memory. A self-selecting material enables selection of a memory cell in an array without requiring a separate selector element and is programmable to one of multiple states to enable the storage of information. In one such example, the self-selecting storage material is a non-phase change chalcogenide material. In one example, the memory element, switching element, or both are an amorphous semiconductor threshold switch (e.g., an ovonic threshold switch) using a chalcogenide amorphous material. An ovonic threshold switch remains in an amorphous state which distinguishes it from an ovonic memory, which generally changes between amorphous and crystalline states. In one example, an ovonic memory is used in series with an ovonic threshold switch. In such case, the ovonic threshold switch operates as the select device for the ovonic memory.

Referring again to the access lines 104, 106, the wordline is for accessing a particular word in a memory array and the bitline is for accessing a particular bit in the word. The access lines 104, 106 can be composed of one or more metals including: Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; conductive metal silicon nitrides including TiSiN and WSiN; conductive metal carbon nitrides including TiCN and WCN, or any other suitable electrically conductive material. In one example in which the access lines include a metal silicon nitride, the metal silicon nitride is embedded in the lines. Typically, the thickness and resistivity of bitlines is the same in all the decks. Similarly, the thickness and resistivity of wordlines is typically the same in all the decks.

In the example illustrated in FIG. 1, the memory array 100 includes conductive electrodes 108, 110 and 112. The electrodes can also be referred to as conductive contacts or electrode contacts. The electrodes can include the same or different materials as the conductive lines. The conductive electrodes 112 are between the access line 104 and the storage material 102, and can be referred to herein as "top electrodes." The conductive electrodes 110 are between the storage material 102 and the selector material 103, and can be referred to as "middle electrodes." The electrodes 108 are between the selector material 103 and the access line 106, and can be referred to as "bottom electrodes." The terms "top," "middle," or "bottom" are used for ease of reference; different labels could be used (e.g., the electrodes 108 could be referred to as "top" electrodes, and the electrodes 112 could be referred to as "bottom" electrodes). Electrodes 108, 110, and 112 electrically couple the layers that are on either side of a given electrode. One or more electrodes in the stack may have multiple layers.

The electrodes can include of a variety of materials. Non-limiting examples can include carbon (C) (e.g. crystalline carbon, amorphous carbon), carbon nitride (CxNy), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicon nitrides (e.g. TiSiN and WSiN, for example), conductive metal carbon nitrides (e.g. TiCN and WCN, for example), conductive metal oxides (e.g. RuO2, for example), the like, or a combination thereof. In one example in which the electrodes include a metal silicon nitride, the metal silicon nitride is embedded in the electrodes. In some examples, each electrode in the memory cell can include or be formed of the same materials. In other examples, one or more electrodes can include or be formed of different materials.

In the example illustrated in FIG. 1, the stack includes an interlayer between the electrodes 112 and the wordlines 104. The interlayer 105 is formed with different properties in different decks to reduce or eliminate the reset current offset. In one example, the interlayer includes tungsten silicon nitride (WSiN). However, the interlayer 105 can include different materials and is not limited to a metal silicon nitride layer. For example, the interlayer can be composed of a metal ceramic composite material, such as a conductive metal nitride or a conductive metal oxide. In one example, the interlayer includes one or more of tungsten, carbon (example of carbon-containing materials include amorphous C, SiC, WCN, and CN), silicon, silicon oxide, silicon nitride, aluminum oxide, hafnium oxide, and titanium silicon nitride. In one example in which the interlayer includes WSiN, W is present from 7 atomic percent (at %) to about 50 at % in the metal ceramic composite material. In some examples, W can be present at from about 10 at % to about 30 at %. Further, Si can typically be present at from about 20 at % to about 60 at % in the metal ceramic composite material. In some examples, Si can be present at from about 20 at % to about 40 at %. As is described in further detail below, the properties of the interlayer 105 can be varied deck-to-deck. For example, the thickness and/or resistivity of the interlayer of one deck is different than the thickness and/or resistivity of another deck.

The memory cells of the array 100 can be programmed by applying voltage pulses to the cells. In one embodiment, writing information to memory cells involves applying voltage pulses with particular polarities to the memory cells. For example, programming a memory cell with a voltage pulse with one polarity results in the memory cell being in one logic state (e.g., a "logic 0"), and programming the memory cell with a voltage pulse with a different polarity results in the memory cell being in a different logic state (e.g., "logic 1"). Decks can be operated at opposite polarities. In one such example, alternating decks are operated at opposite polarity. For example, even decks are operated with one polarity and odd decks are operated with the opposite polarity. In one example, deck 0 is programmed to a reset state in positive polarity (e.g., current flowing from the top to the bottom) while deck 1 is programmed to a reset state in negative polarity (e.g., current flowing from the bottom to the top). The D0 and D1 reset currents show an offset that is compensated for by adjusting the metal silicon nitride properties per deck. Reading memory cells can also involve applying voltage pulses to the memory cells and detecting electrical responses from the memory cells.

In the illustrated example, the storage material 102 is a phase change material. In one such example, programming a memory cell involves sending current through the cell, which creates heat to cause the memory cell to transition from a crystalline to amorphous state, or from an amorphous to crystalline state. The logic states of the memory (e.g., a logic '1' or '0', or a 'set' and 'reset' state) can be defined by the physical state of the phase change material. For example, in one embodiment, amorphous material has high resistivity (e.g., a reset state) and the crystalline material has low resistivity (e.g., a set state).

Although a single level or deck of memory cells is shown in FIG. 1, 3D memory cell arrays typically include multiple levels or decks of memory cells (e.g., in the y-direction).

Figure 2:
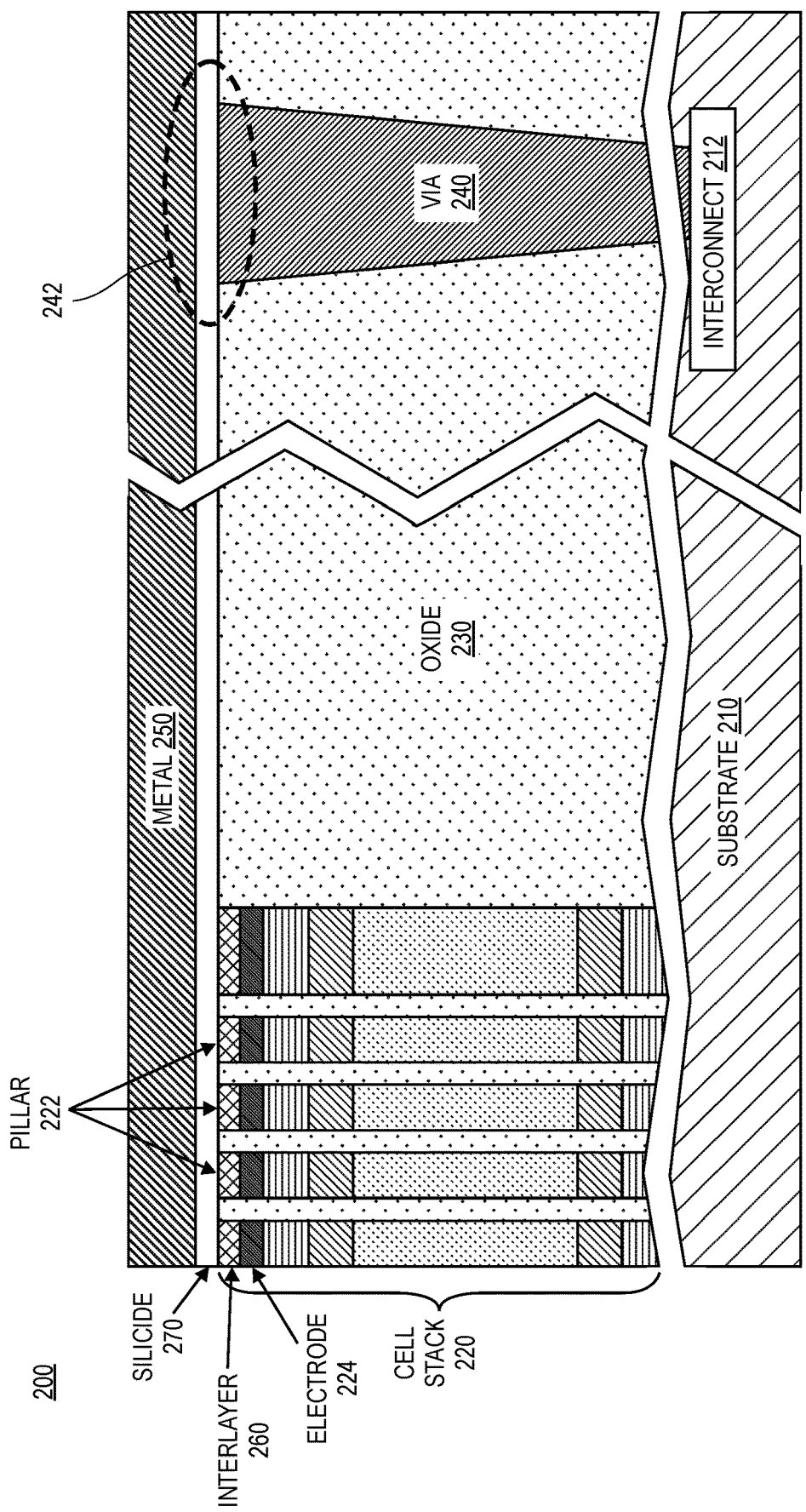
FIG. 2 is a cross-section of an example of a memory circuit.

FIG. 2 is a cross-section of an example of a memory circuit. The circuit 200 includes elements of a stacked memory device. The circuit 200 includes a substrate 210, which represents a semiconductor material on which the memory circuit can be formed. The circuit 200 includes a memory cell stack 220, which represents memory cells of a memory array. The cell stack 220 represents the 3D memory array structure with stacked elements, such as the array 100 of FIG. 1. The circuit 200 represents the cell stack 220 as multiple pillars 222 electrically separated from each other. The pillars 222 can represent selectable memory cells. The cell stack 220 illustrates different layers of memory cells. The layering illustrated is merely illustrative of the fact that the memory cells are formed by layers of material and is not limiting in terms of how many layers, or the type of materials used to form the stack. Different shading and cross-hatching represent that materials can be different from each other. Different areas of shading or cross-hatching can represent multiple elements layered together, and thus do not necessarily represent separate layers of different material.

The circuit 200 includes an oxide 230 to separate the cell stack 220 from the via 240. The break in circuit 200 can indicate that there may be space between the circuit elements that is not shown. It will be understood that the elements in circuit 200 are not necessarily drawn to scale.

In one example, the circuit 200 includes an interlayer 260 between the cell stack 220 and the metal 250. The interlayer can be similar to or the same as the interlayer 105 of FIG. 1. For example, the interlayer can include a layer of WSiN or other similar material. In some prior technologies, a layer of WSiN was disposed over both the cell stack and the via. In such examples, the presence of the metal silicon nitride layer and its interface with the carbon electrodes was able to reduce the reset current, and therefore enabled better management of the power consumption and maximum current that can be delivered. However, the presence of the WSiN film over the via resulted in additional parasitic resistance, which needed to be considered for proper signal delivery and array operation. In those technologies, it was also possible to have a deck-to-deck offset of the reset current (IRST), which in some cases was due to the polarity-driven material segregation that is different between even and odd decks. In prior technologies, such offset was managed by adapting the IRST deck by deck. In contrast, in the circuit in FIG. 2, the interlayer 260 is located over the cell stack but not over the via 240. Thus, the interlayer was either not formed on, or is removed from, the via 240. In one example, the removal of the film over the via opens the opportunity to use different metal silicon nitride layers as a function of the deck because we don't have the interplay between parasitic resistance and reset current that was present in previous technologies.

In one example, the thickness of the interlayer, the resistivity of the interlayer, or both the thickness and resistivity of the interlayer is different for different decks. Typically, such deck-specific variations are undesirable due to the complexity introduced into the processes to manufacture the device. For example, one or more recipe parameters may need to be adjusted, such as time of processing (e.g., etch or deposition), temperature, composition of materials (e.g., flow of gases during deposition), etc. However, it was found that such deck-to-deck variations in the interlayer thickness or resistivity can enable eliminating the reset current offset between decks, which in turn enables the same current to be used for the decks.

The circled area 242 illustrates a connection between the metal 250 and the via 240 without the metal silicon nitride layer 260 between the metal and via. The substrate 210 can include an interconnect 212 to couple the metal 250 to one or more components of the cell stack 220. In one example, the interconnect 212 represents a copper layer that completes a connection of the select line (e.g., the BL or WL). The metal 250 represents a metal contact layer, which can provide connection to specific memory elements or memory cells of the cell stack 220. The via 240 provides an electrical path from the metal 250 to the interconnect 212 or other circuitry on the substrate 210. In one example, the metal 250 represents a wordline. In one example, the metal 250 represents a bitline.

As mentioned above, the inclusion of the interlayer 260 can provide current benefit for selection of memory cells of the cell stack 220. The lack of metal silicon nitride between the metal 250 and the via 240 can provide additional current benefit because of the higher resistivity of the interlayer 260 relative to the metal 250. In one example, the circuit 200 can be processed with first cut and second cut patterning sequences. The metal silicon nitride that traditionally is present in the second cut of the WL/BL stack can be moved to within the first cut at the top of the memory cell stack 220. Thus, in contrast to a traditional circuit processing approach, the circuit 200 includes the interlayer 260 over the cell stack 220, and not over the via 240. Thus, in the illustrated example, the interlayer 260 would not be a continuous film beneath the metal 250, but is present at the top of the cell stack 220 in the crosspoint structure. As illustrated, as part of the crosspoint structure, the interlayer 260 is patterned (e.g., has gaps) instead of being continuous below the metal 250.

In one example, circuit 200 includes a silicide layer 270. The silicide 270 can provide a seed layer for the metal 250. The silicide 270 can be or include an amorphous metal silicide. The silicide 270 allows the metal 250 to structure well. The silicide 270 can provide higher tensile strength, as well as improving current delivery. At the area 242, it can be observed that while there is no interlayer between the metal 250 and the via 240, there is a layer of silicide.

In one example, the circuit 200 includes a top electrode layer over the cell stack. In one example, the electrodes 224 include a carbon layer. Carbon 224 can provide a desired thermal barrier and desired electrical device performance while still allowing for high current delivery to memory cells. In one example, the carbon directly contacts the interlayer 260.

It will be understood that circuit 200 can be part of an integrated circuit (I/C) chip, such as a memory chip. The memory chip can couple to a processor. The processor can be part of a host system, or can be part of a memory circuit, such as a controller within a solid state memory device.

Figure 3:
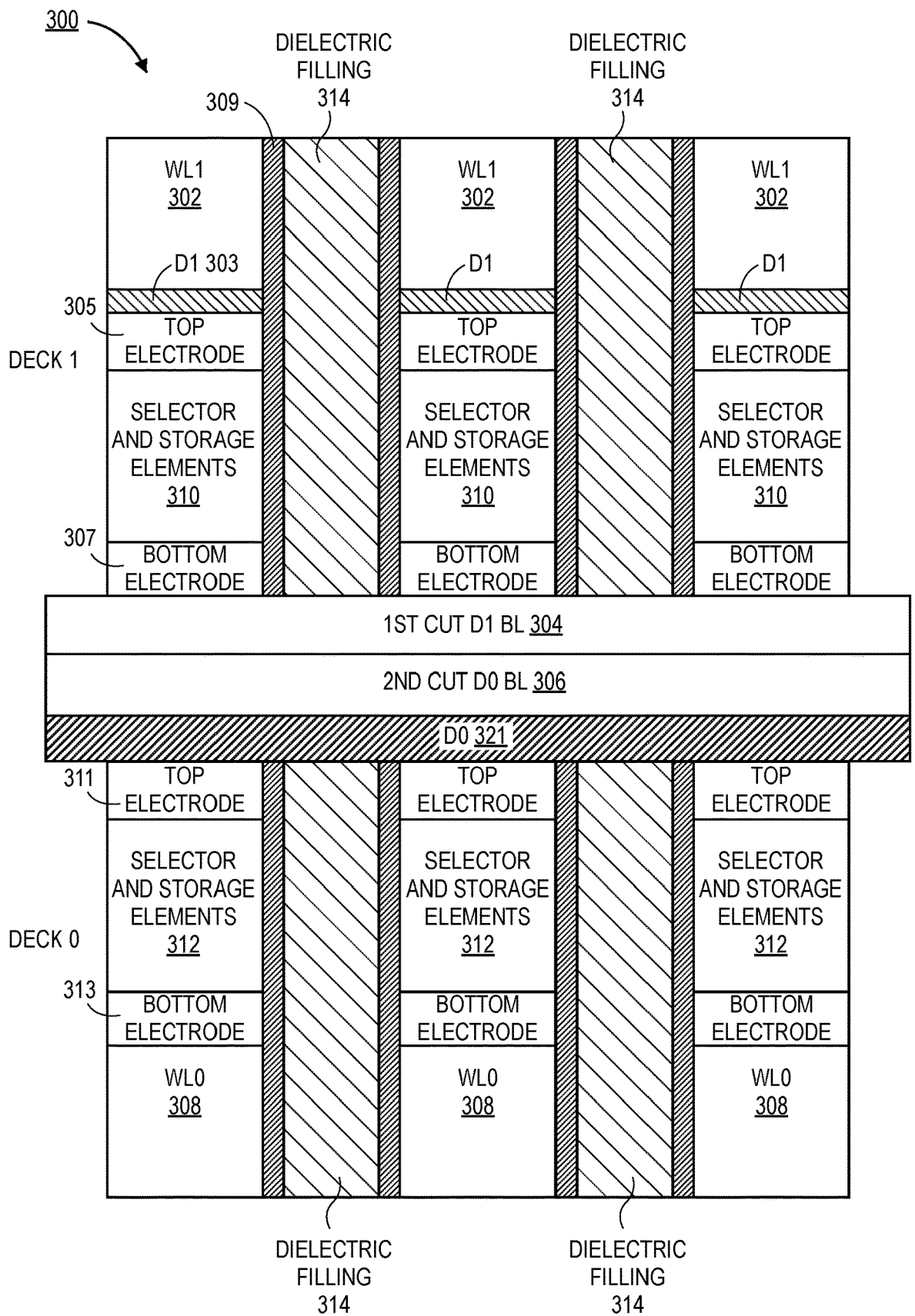
FIG. 3 is a cross-sectional view of an example of a portion of a memory cell array.

FIG. 3 is a cross-sectional view of a portion of a memory cell array 300. The memory cell array 300 is an example of a 3D cross-point memory structure. The memory cell array 300 has two decks, deck 0 and deck 1. The decks can include layers of material in the same or a different order relative to one another. The decks each have conductive wordlines. The decks can each have their own bitlines or be separated by common bitlines. The term "common bitline" can refer to a single bitline, or bitlines for multiple decks that are in electrical contact with one another. In the illustrated example, deck 0 and deck 1 have their own bitlines 304 and 306. The conductive access lines enable access to the memory cells of the array. Between the bitlines and wordlines, each of the decks includes electrodes, selector elements, and storage elements. A deck of memory cells can include additional or different elements than the example illustrated in FIG. 3. For example, the storage elements may be surrounded by a lamina (e.g., a thin dielectric layer) (not shown) to lower the interface resistance and avoid additional parasitic voltage drops. In another example, the stack may include another electrode layer between the storage and selector elements (not shown).

In one example, the storage elements include elements that are programmable to one of multiple states that correspond to logic states. The storage elements can also be referred to as memory elements. The selector elements enable accessing a single bit in the array, in accordance with embodiments. Although the selector and storage elements 310, 312 are illustrated with a single layer, the selector and storage elements may be formed from different materials or may include a single self-selecting storage material. The electrodes 305, 307, 311, and 313 are conductive elements or structures that electrically couple the elements that are on either side of the electrode.

In the example illustrated in FIG. 3, the memory cells are separated from one another physically and electrically via the sealing material 309 and the filling material 314. In one example, the sealing material 309 includes a dielectric material. The sealing material can include, for example: silicon oxides, silicon nitrides, silicon oxynitrides, other oxides (such as alumina, hafnium oxides, titanium oxides, zirconium oxides), high-k materials, non-conductive nitrides, or other materials capable of acting as a sealing material. The sealing material 309 can function as an insulator and/or chemical barrier to electrically insulate different structures and protect materials from contamination. The filler material 314 can include the same or different material as the sealing material 309. For example, the filler material 314 can include a dielectric material. The filler material 314 can include, for example, silicon oxide ($SiO_2$), SOD (spin on dielectric), SiN or other suitable dielectric.

The decks also include an interlayer between storage element and the conductive access lines. For example, deck 0 includes the interlayer 321 (D0) between the electrodes 311 and the bitlines 306. Similarly, deck 1 includes an interlayer 303 (D1) between electrodes 305 and the wordlines 302. The interlayers 321 and 303 can be the same as or similar to the interlayer 105 of FIG. 1 and 260 of FIG. 2. The interlayers of deck 0 and deck 1 have different properties. In the illustrated example, the interlayer D0 is thicker than the interlayer D1. However, in another example the interlayer D1 can be thicker than the interlayer D0. In yet another example, the interlayers have the same thickness, but another property is varied between the layers. For example, the resistivity of the layers can be varied. Thus, in one example, the metal silicon nitride layer is differentiated in odd/even deck by its thickness and/or resistivity. Further differentiation can occur to accommodate additional deck-to-deck offset between the metal silicon nitride of additional decks (e.g., D0/D1/D2/D3, etc.).

FIG. 4 is a table illustrating examples of the thickness and resistivity of tungsten silicon nitride layers in two decks and the resulting impact on reset current in those decks. The examples in FIG. 4 are for illustration and are not limiting. Interlayers may have thicknesses and resistivities that are less than or greater than the values in table 4.

The table in FIG. 4 illustrates four examples. The examples in FIG. 4 are based on a memory array that was determined to have the following sensitivities: D0 thickness: −1 uA/1 nm, D0 rho (resistivity): −1.3 uA/100 mOhm cm, D1 thickness: −1 uA/1 nm, and D1 rho: −1.3 uA/100 mOhm cm. Thus, a 1 nm increase in thickness of D0 or D1 results in a −1 uA change in the reset current.

Example 0 is an example of a device in which the tungsten silicon nitride layers in both decks has the same thickness and the same resistivity. Specifically, the tungsten silicon nitride layer D0 of deck 0 has a thickness of 50 Angstrom (A) and the tungsten silicon nitride layer D1 of deck 1 has the same thickness of 50 A. Similarly, the resistivity of both D0 and D1 is 190 mOhm cm. By forming a tungsten silicon nitride layer with the same properties for each deck, the manufacturing process can be simplified. However, the reset current of the two decks is different. In Example 0, the reset current for D0 is 122 µA and the reset current for D1 is 115 µA. Conventionally, such differences in reset current are accounted for in the control circuitry. However, adjusting the reset current depending on the deck being accessed adds complexity to the control circuitry. For example, in Example 0 where the reset currents are different, when you want to program a certain codeword in a deck, the control logic adjusts the reset current depending on the deck, which adds complexity to the management.

Examples 1-3 illustrate different ways to vary the thickness and resistivity deck-to-deck to achieve the same reset current for each deck. Example 1 illustrates tungsten silicon nitride layers having the same resistivity but different thicknesses for deck 0 and deck 1. Specifically, Example 1 shows D0 having a thickness of 90 A and D1 having a thickness of 30 A. In Example 1, both D1 and D0 have a resistivity of 90 mOhm cm. By varying the thickness of the tungsten silicon nitride layers for deck 0 and deck 1, the same reset current can be achieved. In Example 2, the reset current for both D0 and D1 is 119 µA. Example 2 illustrates tungsten silicon nitride layers having the same thickness but different resistivities. Specifically, Example 2 shows D0 having a resistivity of 500 mOhm cm and D1 having a resistivity of 10 mOhm cm. In Example 2, both D1 and D0 have a thickness of 50 A. By varying the resistivity of the tungsten silicon nitride layers for deck 0 and deck 1, the same reset current can be achieved. In Example 3, the reset current for both D0 and D1 is 118 µA. Example 3 illustrates metal silicon nitride layers having different thicknesses and different resistivities for deck 0 and deck 1. D0 has a thickness of 70 A and D1 has a thickness of 30 A. In Example 3, D0 has a resistivity of 220 mOhm cm and D1 has a resistivity of 90 mOhm cm. By varying both the thickness and resistivity of the tungsten silicon nitride layers for deck 0 and deck 1, the same reset current can be achieved. In Example 3, the reset current for both D0 and D1 is 119 µA. Thus, each deck can have a tungsten silicon nitride layer having a different thickness and/or resistivity, which can enable the same reset current for each deck. Having the same programming current for all the decks can greatly simplify management from periphery point of view.

Each example has its own benefits and disadvantages. As discussed above, although Example 0 is simplest in terms of manufacturing process, there is significant complexity added to the control circuitry. Option 1 in which the thickness is different for deck 0 and deck 1 is stable in terms of process control because the tungsten silicon nitride layers have the same resistivity for both decks. However, in this example, the etch processes between decks would need to be adjusted to account for the difference in thickness of the tungsten silicon nitride layers. Option 2 in which the resistivity is different for the tungsten silicon nitride layers of deck 0 and deck 1 enables using the same processes for thickness, but may be less stable in terms of controlling resistivity. The resistivity can be changed by, for example, adjusting the flow of nitrogen during deposition. Other recipe parameters may be varied to achieve different resistivity, for example, the temperature may be adjusted during the deposition. Option 3, which has different thickness and resistivity introduces complexity into the process, however, by varying both the thickness and the resistivity, a smaller difference in each parameter can be selected to achieve the same reset current for both decks.

The examples in the table of FIG. 4 are specific examples using a WSiN film. Other materials, thicknesses, and resistivities can be used. In one example, the thickness of the interlayer of one deck is a fraction of the thickness of the interlayer of another deck. For example, the interlayer of deck 1 can be ½, ⅓, ¼, etc. the thickness of the interlayer of deck 0. In one example, the resistivity of the interlayer of one deck is 2× (two times), 3×, 4×, 10×, etc. the resistivity of the interlayer of another deck. However, other Referring to the examples of FIG. 4, in Example 1, the thickness of D1 is ⅓ the thickness of D0. In example 2, the resistivity of D0 is 50× the resistivity of D1. In example 3, the thickness of D1 is between ⅓ and ½ the thickness of D0. In example 3, the resistivity of D0 is between 2-3 times greater than the resistivity of D1.

Figure 5:
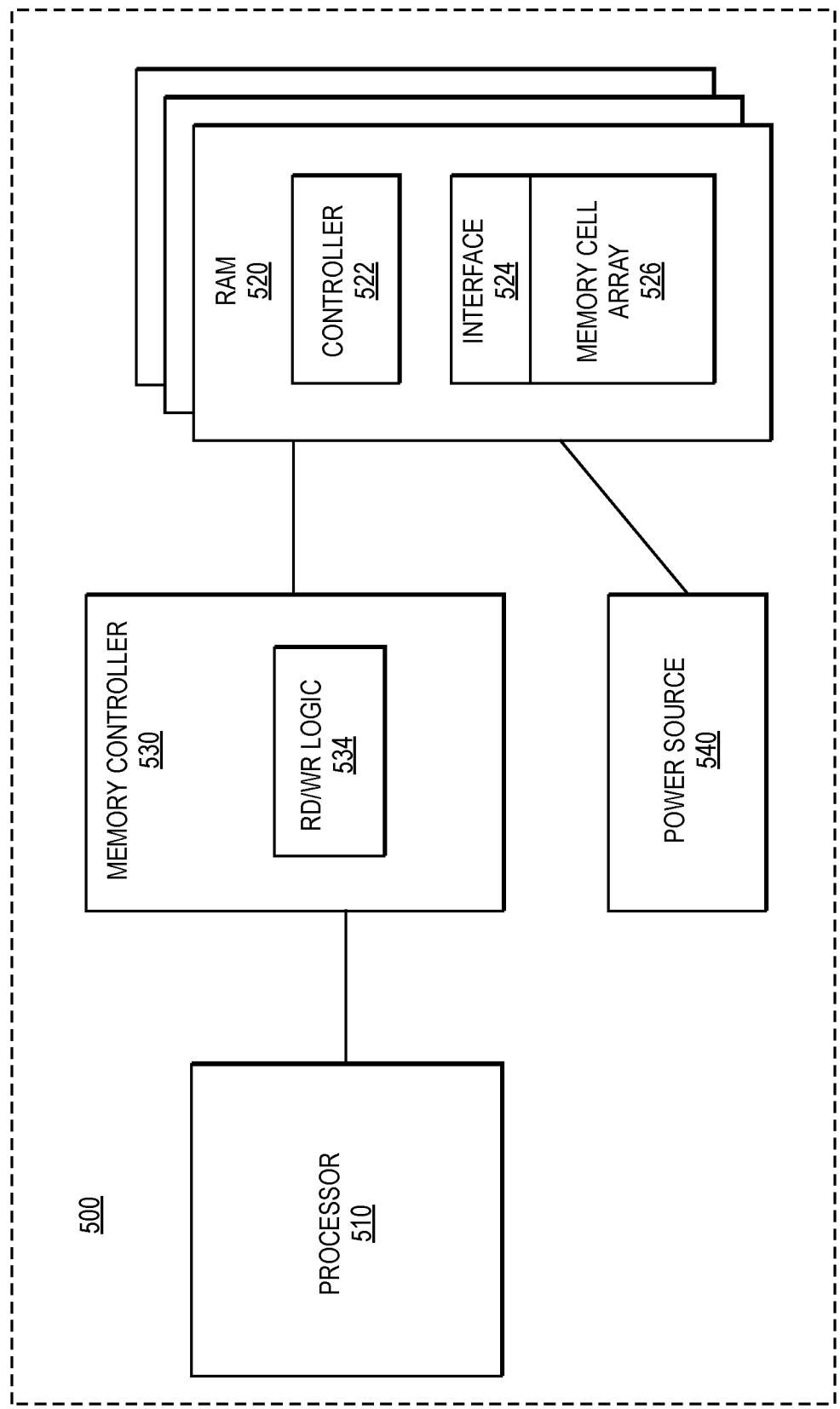
FIG. 5 is a block diagram of a system that can include a non-volatile memory device with differences in the metal silicon nitride layer of different decks.

FIG. 5 is a block diagram of a system that can include a non-volatile memory device with differences in the metal silicon nitride layer of different decks.

System 500 includes components of a memory subsystem having random access memory (RAM) 520 to store and provide data in response to operations of processor 510. System 500 receives memory access requests from a host or a processor 510, which is processing logic that executes operations based on data stored in RAM 520 or generates data to store in RAM 520. Processor 510 can be or include a host processor, central processing unit (CPU), microcontroller or microprocessor, graphics processor, peripheral processor, application specific processor, or other processor, and can be single core or multicore.

System 500 includes memory controller 530, which represents logic to interface with RAM 520 and manage access to data stored in the memory. In one embodiment, memory controller 530 is integrated into the hardware of processor 510. In one embodiment, memory controller 530 is stand-alone hardware, separate from processor 510. Memory controller 530 can be a separate circuit on a substrate that includes the processor. Memory controller 530 can be a separate die or chip integrated on a common substrate with a processor die (e.g., as a system on a chip (SoC)). In one embodiment, memory controller 530 is an integrated memory controller (iMC) integrated as a circuit on the processor die. In one embodiment, at least some of RAM 520 can be included on an SoC with memory controller 530 and/or processor 510.

In the illustrated example, memory controller 530 includes read/write logic 534, which includes hardware to interface with RAM 520. Logic 534 enables memory controller 530 to generate read and write commands to service requests for data access generated by the execution of instructions by processor 510.

The memory resources or cachelines in RAM 520 are represented by memory cell array 526, which can include a 3D crosspoint array with deck-to-deck differences in the resistivity and/or thickness of the metal silicon nitride layers. RAM 520 includes interface 524 (e.g., interface logic) to control the access to memory device array 526. Interface 524 can include decode logic, including logic to address specific rows or columns or bits of data. In one embodiment, interface 524 includes logic to control the amount of current provided to specific memory cells of memory device array 526. Thus, control over writing to memory device array 526 can occur through driver and/or other access logic of interface 524. Controller 522 represents an on-die controller on RAM 520 to control its internal operations to execute commands received from memory controller 530. For example, controller 522 can control any of timing, addressing, I/O (input/output) margining, scheduling, and error correction for RAM 520.

In one example, the controller 522 is configured to read and write memory device array 526 in accordance with any embodiment described herein. In one example, the controller can apply the same reset current to reset memory cells regardless of the deck due to the different metal silicon nitride layers in the different decks. In one example, controller 522 can differentiate between different logic-states as a consequence of the programming polarity of a memory cell. For example, the controller 522 can read a memory cell by applying a voltage drop via interface 524 to the memory cell to determine the state (e.g., a higher stable state or lower stable state) of the memory cell.

Figure 6:
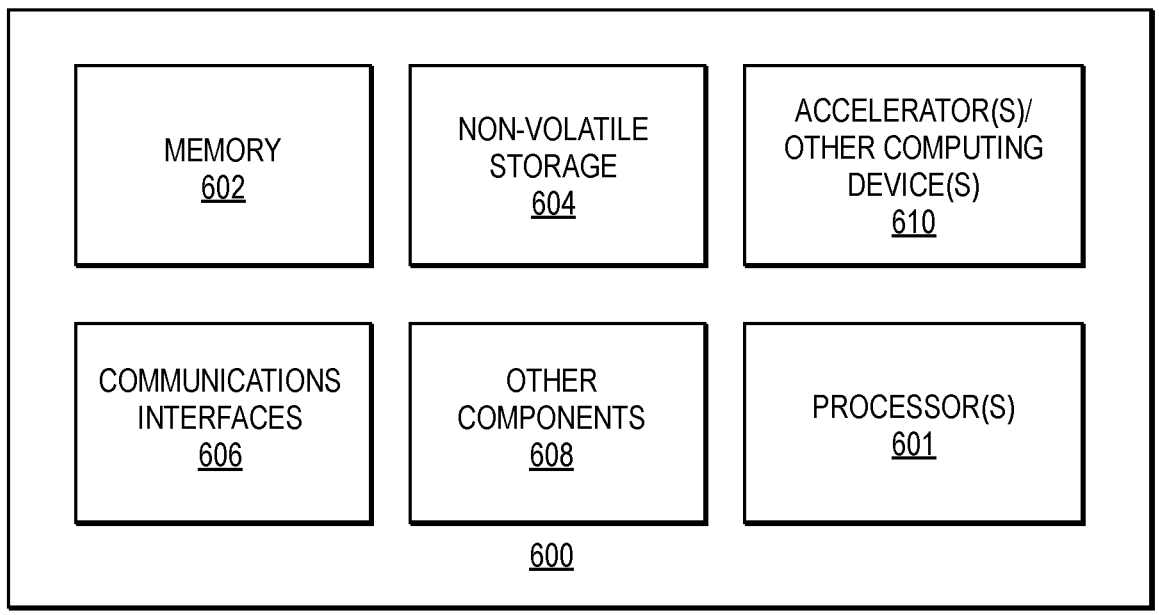
FIG. 6 provides an exemplary depiction of a computing system.

FIG. 6 provides an exemplary depiction of a computing system 600 (e.g., a smartphone, a tablet computer, a laptop computer, a desktop computer, a server computer, etc.). As observed in FIG. 6, the system 600 may include one or more processors or processing units 601. The processor(s) 601 may include one or more central processing units (CPUs), each of which may include, e.g., a plurality of general-purpose processing cores. The processor(s) 601 may also or alternatively include one or more graphics processing units (GPUs) or other processing units. The processor(s) 601 may include memory management logic (e.g., a memory controller) and I/O control logic. The processor(s) 601 can be similar to, or the same as, the processor 510 of FIG. 5.

The system 600 also includes memory 602 (e.g., system memory), non-volatile storage 604, communications interfaces 606, and other components 608. The other components may include, for example, a display (e.g., touchscreen, flat-panel), a power supply (e.g., a battery or/or other power supply), sensors, power management logic, or other components. The communications interfaces 606 may include logic and/or features to support a communication interface. For these examples, communications interface 606 may include one or more communication interfaces that operate according to various communication protocols or standards to communicate over direct or network communication links or channels. Direct communications may occur via use of communication protocols or standards described in one or more industry standards (including progenies and variants) such as those associated with the PCIe specification. Network communications may occur via use of communication protocols or standards such those described in one or more Ethernet standards promulgated by IEEE. For example, one such Ethernet standard may include IEEE 802.3. Network communication may also occur according to one or more OpenFlow specifications such as the OpenFlow Switch Specification. Other examples of communications interfaces includes, for example, a local wired point-to-point link (e.g., USB) interface, a wireless local area network (e.g., WiFi) interface, a wireless point-to-point link (e.g., Bluetooth) interface, a Global Positioning System interface, and/or other interfaces.

The computing system also includes non-volatile storage 604, which may be the mass storage component of the system. The non-volatile storage 604 can be similar to, or the same as, the RAM 520 of FIG. 5, described above. Non-volatile storage 604 may include byte or block addressable types of non-volatile memory having a three-dimensional (3D) cross-point memory structure hereinafter referred to as "3D cross-point memory". Non-volatile types of memory may also include other types of byte or block addressable non-volatile memory such as, but not limited to, multi-threshold level NAND flash memory (e.g., 3D NAND flash memory), NOR flash memory, single or multi-level phase change memory (PCM), resistive memory, nanowire memory, ferroelectric transistor random access memory (FeTRAM), magnetoresistive random access memory (MRAM) that incorporates memristor technology, spin transfer torque MRAM (STT-MRAM), or a combination of any of the above. In one example, the non-volatile storage 604 may include mass storage that is composed of one or more SSDs. SSDs can be composed of flash memory chips that include the deck-to-deck variations in the metal oxide layer described above.

Examples of techniques for suppression of reset current deck-to-deck offset follow. In one example, a memory device includes a first deck of memory cells having layers of material including a first layer of phase change material, and a first interlayer between the layer first phase change material and first conductive access lines. In one example, the first interlayer includes one or more of tungsten, carbon, silicon, silicon oxide and silicon nitride. The memory device includes a second deck of memory cells over the first deck of memory cells, the second deck having layers of material including a second layer of phase change material and a second interlayer between the second layer of phase change material and second conductive access lines. In one example, the second interlayer includes one or more of tungsten, carbon, silicon, silicon oxide and silicon nitride and has a different thickness than the first interlayer. In one example, the first interlayer and the second interlayer include tungsten silicide nitride.

In one example, the first interlayer is between the first layer phase change material and first conductive bitlines and the second interlayer is between the second phase change material and second conductive wordlines. In one example, the first conductive bitlines include shared bitlines between the first and second decks. In one example, the memory device further includes second conductive bitlines between the first deck and the second layer of phase change material. In one example, the first interlayer has a different resistivity than the second interlayer. In one example, the first interlayer has a higher concentration of nitrogen than the second interlayer. In one example, the first interlayer has a different polycrystal size than the second interlayer. In one example, the second deck includes layers of material in an order opposite relative to the first deck. In one example, the first deck includes a first layer of selector material over the first layer of phase change material and the second deck includes the second layer of phase change material over a second layer of selector material. In one example, the first deck includes the first layer of phase change material over a first layer of selector material and the second deck includes a second layer of selector material over the second layer of phase change material.

In one example, a memory device includes a first deck of memory cells having layers of material, including a first layer of phase change material, and a first interlayer between the layer first phase change material and first conductive access lines, the first interlayer including one or more of tungsten, carbon, silicon, silicon oxide and silicon nitride. The memory device includes a second deck of memory cells over the first deck of memory cells, the second deck having layers of material including a second layer of phase change material, and a second interlayer. In one example, the second interlayer including one or more of tungsten, carbon, silicon, silicon oxide and silicon nitride and having a different resistivity than the first interlayer.

In one example, a system includes a memory controller, and a memory device communicatively coupled with the memory controller, the memory device including a first deck of memory cells having layers of material, the layers including a first layer of phase change material, and a first interlayer of between the layer first phase change material and first conductive access lines, the first interlayer including one or more of tungsten, carbon, silicon, silicon oxide and silicon nitride, and a second deck of memory cells over the first deck of memory cells, the second deck having layers of material including a second layer of phase change material, and a second interlayer between the second layer of phase change material and second conductive access lines, the second interlayer including one or more of tungsten, carbon, silicon, silicon oxide and silicon nitride and having a different resistivity than the first layer of tungsten silicide nitride. In one example, the controller includes circuitry to access the memory cells of the first and second decks, the circuitry to apply a current with the same magnitude and opposite polarity to the first and second decks.

Thus, the resistance of the metal silicon nitride layer can be tuned (both through thickness and resistivity) as a function of the deck to remove the deck-to-deck offset in reset current, which can simplify circuit management.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:
1. A memory device comprising:
  a first deck of memory cells comprising a first stack of layers of material, including:
    a first layer of a chalcogenide storage material,
    a first layer of selector material, and
    a first interlayer between the first layer first of chalcogenide storage material and first conductive access lines, the first interlayer including one or more of tungsten, carbon, silicon, silicon oxide, silicon nitride, aluminum oxide, hafnium oxide, and titanium silicon nitride; and
  a second deck of memory cells over the first deck of memory cells, the second deck comprising a second stack of layers of material including:
    a second layer of a chalcogenide storage material,
    a second layer of selector material, and a second interlayer between the second layer of chalcogenide storage material and second conductive access lines, the second interlayer including one or more of tungsten, carbon, silicon, silicon oxide and silicon nitride and having a different thickness than the first interlayer, wherein the thickness of a layer in the first stack or the second stack is a distance between opposite surfaces of the layer in the direction of stacking.

2. The memory device of claim 1, wherein:
the first interlayer and the second interlayer comprise tungsten silicide nitride.

3. The memory device of claim 1, wherein:
the first interlayer is between the first layer of chalcogenide storage material and first conductive bitlines; and
the second interlayer is between the second layer of chalcogenide storage material and second conductive wordlines.

4. The memory device of claim 3, wherein:
the first conductive bitlines comprise shared bitlines between the first and second decks.

5. The memory device of claim 2, further comprising:
second conductive bitlines between the first deck and the second layer of chalcogenide storage material.

6. The memory device of claim 1, wherein:
the first interlayer has a different resistivity than the second interlayer.

7. The memory device of claim 6, wherein the first interlayer has a higher concentration of nitrogen than the second interlayer.

8. The memory device of claim 1, wherein the first interlayer has a different polycrystal size than the second interlayer.

9. The memory device of claim 1, wherein:
the second deck includes layers of material in an order opposite relative to the first deck.

10. The memory device of claim 1, wherein:
the first and second layers of chalcogenide storage material comprise a phase change material.

11. The memory device of claim 1, wherein:
the first and second layers of chalcogenide storage material comprise self-selecting storage material to both select cells and store data.

12. A memory device comprising:
a first deck of memory cells comprising layers of material, including:
a first layer of phase change material, and
a first interlayer between the first layer first of phase change material and first conductive access lines, the first interlayer including one or more of tungsten, carbon, silicon, silicon oxide, silicon nitride, aluminum oxide, hafnium oxide, and titanium silicon nitride; and
a second deck of memory cells over the first deck of memory cells, the second deck comprising layers of material including:
a second layer of phase change material, and
a second interlayer, the second interlayer including one or more of tungsten, carbon, silicon, silicon oxide and silicon nitride and having a different resistivity and thickness than the first interlayer.

13. The memory device of claim 12, wherein:
the first and second interlayers include tungsten silicide nitride.

14. The memory device of claim 12, wherein the first interlayer has a higher concentration of nitrogen than the second interlayer.

15. The memory device of claim 12, wherein:
the first interlayer is between the first layer of phase change material and first conductive bitlines; and
the second interlayer is between the second layer of phase change material and second conductive wordlines.

16. The memory device of claim 12, wherein:
the first conductive access lines comprise shared bitlines between the first and second decks.

17. The memory device of claim 12, further comprising:
second conductive bitlines between the first deck and the second layer of phase change material.

18. A memory device comprising:
a first deck of memory cells comprising layers of material, including:
a first layer of chalcogenide storage material, and
a first interlayer between the first layer of chalcogenide storage material and first conductive access lines, the first interlayer including one or more of tungsten, carbon, silicon, silicon oxide, silicon nitride, aluminum oxide, hafnium oxide, and titanium silicon nitride; and
a second deck of memory cells over the first deck of memory cells, the second deck comprising layers of material including:
a second layer of chalcogenide storage material, and
a second interlayer between the second layer of chalcogenide storage material and second conductive access lines, the second interlayer including one or more of tungsten, carbon, silicon, silicon oxide and silicon nitride and having a different thickness and polycrystal size than the first interlayer.

19. The memory device of claim 18, wherein:
the first interlayer and the second interlayer comprise tungsten silicide nitride.

20. The memory device of claim 18, wherein:
the first interlayer is between the first layer of chalcogenide storage material and first conductive bitlines; and
the second interlayer is between the second layer of chalcogenide storage material and second conductive wordlines.

* * * * *